US011623464B1

(12) United States Patent
Hightower et al.

(10) Patent No.: US 11,623,464 B1
(45) Date of Patent: Apr. 11, 2023

(54) SYSTEM AND METHOD FOR DETECTION OF POSITION AND MOTION

(71) Applicant: KIDS2, INC., Atlanta, GA (US)

(72) Inventors: Alan Hightower, Austell, GA (US); Jonathan Zufi, Atlanta, GA (US)

(73) Assignee: KIDS2, INC., Atlanta, GA (US)

( * ) Notice: Subject to any disclaimer, the term of this patent is extended or adjusted under 35 U.S.C. 154(b) by 474 days.

(21) Appl. No.: 16/585,371

(22) Filed: Sep. 27, 2019

Related U.S. Application Data (60) Provisional application No. 62/738,596, filed on Sep. 28, 2018.

(51) Int. Cl.
| | | |
|---|---|---|
| *B42D 1/00* | (2006.01) | |
| *B42D 3/12* | (2006.01) | |
| *G01D 5/20* | (2006.01) | |
| *G01D 5/24* | (2006.01) | |
| *G01P 13/00* | (2006.01) | |

(52) U.S. Cl.
CPC ............ *B42D 1/007* (2013.01); *B42D 3/123* (2013.01); *G01D 5/20* (2013.01); *G01D 5/24* (2013.01); *G01P 13/00* (2013.01); *B42P 2241/16* (2013.01)

(58) Field of Classification Search
CPC .......... B42D 1/00; B42D 1/003; B42D 1/007; B42D 3/00; B42D 3/12; B42D 3/123; G01D 5/00; G01D 5/12; G01D 5/14; G01D 5/20; G01D 5/24; G01P 13/00; B42P 2241/00; B42P 2241/16
USPC .................. 324/200, 207.11, 207.13, 207.15
See application file for complete search history.

(56) References Cited

U.S. PATENT DOCUMENTS

| | | |
|---|---|---|
| 6,716,031 B2 | 4/2004 | Wood et al. |
| 7,227,069 B1 | 6/2007 | Sanderson |
| 8,093,482 B1 | 1/2012 | Kramer et al. |
| 8,395,040 B1 | 3/2013 | Kramer et al. |
| 8,568,213 B2 | 10/2013 | Osnato et al. |
| 8,594,557 B2 | 11/2013 | Taylor et al. |
| 8,819,533 B2 | 8/2014 | Trotto et al. |
| 8,878,042 B2 | 11/2014 | Van Wagoner et al. |

(Continued)

FOREIGN PATENT DOCUMENTS

| | | |
|---|---|---|
| CA | 2484914 A1 | 12/2003 |
| CN | 103908780 A | 7/2014 |

(Continued)

OTHER PUBLICATIONS

Caven, Ian; "Music Keyboard Inductively Senses Position & Velocity"; EDN Network; Apr. 25, 2014; 2 pgs.

*Primary Examiner* — Hoai-An D. Nguyen
(74) *Attorney, Agent, or Firm* — Gardner Groff & Greenwald, PC (57) ABSTRACT

A system that combines an integrated circuit, sensors, and a detectable material on a device. The sensors are generally capable of detecting the presence of multiple substrates as well as their orientation relative to each other. In example embodiments, the sensors can also detect the velocity and direction of motion of the detectable material. In an example mode of use, the system is installed in a children's device, such as an interactive book. The detectable material is embedded in each page of the book such that the sensors can determine which page the book is open to the user. The integrated circuit can process the page open information to produce an output, such as a sound from a speaker.

15 Claims, 7 Drawing Sheets

(56) References Cited

U.S. PATENT DOCUMENTS

| | | |
|---|---|---|
| 8,882,561 B2 | 11/2014 | Dyer et al. |
| 8,888,100 B2 | 11/2014 | Kamph et al. |
| 9,672,668 B2 | 6/2017 | Yu |
| 2006/0052172 A1 | 3/2006 | Stephen et al. |
| 2006/0084361 A1 | 4/2006 | Favorito et al. |
| 2008/0268416 A1* | 10/2008 | Wallace ............ G09B 5/062 434/317 |
| 2011/0059426 A1* | 3/2011 | Mamigonians ........ G09B 5/062 434/317 |
| 2011/0195392 A1 | 8/2011 | Kim |
| 2014/0194029 A1 | 7/2014 | Pardi et al. |
| 2016/0063875 A1* | 3/2016 | Javidan ............ G09B 5/065 434/317 |
| 2016/0109976 A1 | 4/2016 | Nguyen |
| 2016/0328080 A1* | 11/2016 | Miyake ............ G02F 1/133308 |

FOREIGN PATENT DOCUMENTS

| | | | | |
|---|---|---|---|---|
| GB | 2506862 A | * | 4/2014 | ............ A63H 33/38 |
| GB | 2528684 A | * | 2/2016 | ............ A63H 33/38 |
| WO | 2005053806 A2 | | 6/2005 | |
| WO | WO-2019049079 A1 | * | 3/2019 | ............ B42D 1/007 |

* cited by examiner fig.1

SYSTEM AND METHOD FOR DETECTION OF POSITION AND MOTION

CROSS-REFERENCE TO RELATED APPLICATION

This application claims the benefit of U.S. Provisional Patent Application Ser. No. 62/738,596 filed Sep. 28, 2018, the entirety of which is hereby incorporated herein by reference for all purposes.

TECHNICAL FIELD

The present disclosure relates generally to the field of systems and methods for detecting position or motion, and more particularly to a children's device comprising a system and method for detecting contact or position.

BACKGROUND

It is known to have interactive children's devices such as interactive books. The interactive books are configured to output sounds, lights, etc. based on the page of the book that is open to the user. Current systems and methods for determining the page position and motion in these interactive books are often bulky, require many parts, and can be unreliable. For example, known systems and methods often require bulky hinges, cameras, or switches. In other known methods, an infrared sensor is used to detect light through a series of holes in the pages. In these systems, the pages are often thick and rigid to ensure that the holes are correctly positioned. Accordingly, it can be seen that needs exist for an improved system for detection of position and motion that can be used in children's devices such as interactive books.

It is to the provision of a system and method for detection of position and motion meeting these and other needs that the present disclosure is primarily directed.

SUMMARY

In example embodiments, the present disclosure provides a system that combines an integrated circuit, sensors, and a detectable material on a device. The sensors are generally capable of detecting the presence of multiple substrates as well as their orientation relative to each other. In example embodiments, the sensors can also detect the velocity and direction of motion of the detectable material. In an example mode of use, the system is installed in a children's device, such as an interactive book. The detectable material is embedded in each page of the book such that the sensors can determine which page of the book is open to the user. The integrated circuit can process the page open information to produce an output, such as a sound from a speaker.

In one aspect, the present disclosure relates to a system for detection of position and motion comprising a base comprising at least one sensor configured to detect the presence of a detectable material through induction and an integrated circuit configured to receive data from the at least one sensor; a first item configured to be positioned over the base, the first item having an embedded substrate of the detectable material in a specific position and/or orientation; and at least a second item configured to be positioned over the base, the second item having an embedded substrate of the detectable material in a specific position and/or orientation that is different than the position and/or orientation of the embedded substrate of in the first item; wherein the at least one sensor and integrated circuit can determine the presence of the first and second items over the base and their orientation based on detection of the embedded substrates.

In another aspect, the present disclosure relates to a system for detecting an open page number of an interactive book comprising a cover and a plurality of pages; the system comprising a metallic material substrate embedded at a position in each of the plurality of pages, wherein the embedded substrate position in each page is unique; a sensor embedded in the cover of the book, wherein the sensor is configured to detect the proximity of the embedded substrates; and an integrated circuit configured to process data received from the sensor to determine the open page number.

These and other aspects, features, and advantages of the invention will be understood with reference to the drawing figures and detailed description herein, and will be realized by means of the various elements and combinations particularly pointed out in the appended claims. It is to be understood that both the foregoing general description and the following brief description of the drawings and detailed description of example embodiments are explanatory of example embodiments of the invention, and are not restrictive of the invention, as claimed.

DETAILED DESCRIPTION OF EXAMPLE EMBODIMENTS

The present disclosure may be understood more readily by reference to the following detailed description of example embodiments taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Any and all patents and other publications identified in this specification are incorporated by reference as though fully set forth herein.

Also, as used in the specification including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment.

With reference now to the drawing figures, wherein like reference numbers represent corresponding parts throughout the several views, FIGS. 1-11 show, generally, example embodiments of a system 10, 110 that combines an integrated circuit (IC), sensors, and a detectable material on a device. In example embodiments, the sensors are positioned on a base or cover and the detectable material is positioned in or on one or more items that will be positioned over the base or cover. The sensors are generally capable of detecting the presence of multiple substrates of detectable material as well as their orientation relative to each other. In example embodiments, the sensors can also detect the velocity and direction of motion of the detectable material. In example embodiments, the sensors determine the position and/or orientation of the detectable material to determine which item is positioned over the base or cover. In other embodiments, a stack of items is positioned over the base or cover. The IC is configured to process the sensor data detecting multiple substrates of detectable material to determine what item in the stack is on top.

In example embodiments, the sensors are formed from a coil or a grid of coils and the detectable material is a metallic material such as a thin metallic foil. The coils detect the presence of the metallic material through induction. The metallic material can be low cost and low grade. The grid of coils can be on one or more printed circuit boards. In example embodiments, the coils have a diameter that is between one and two times the thickness of the base and the items positioned over the base to ensure adequate margins. For example, when the system is used in an interactive book, as described below, the coils have a diameter between one and two times the thickness of the book pages and cover. The metallic material substrate can have a diameter between 1 cm and 80% of the diameter of the coils. The coils and the metallic material substrate generally have a thickness of less than 3 mm. The IC is configured to determine not only the presence of the metallic material in proximity to the coil sensors but also its orientation and position relative to metallic material in other items. Generally, the coils, metallic material, and IC are thin such that they can be embedded in a relatively flat base and/or item. An example integrated circuit is the Cypress PSoC 4700S microcontroller. The IC can have an area of around 8 cm$^3$ and can have a thickness of around 3 mm.

Figure 5:
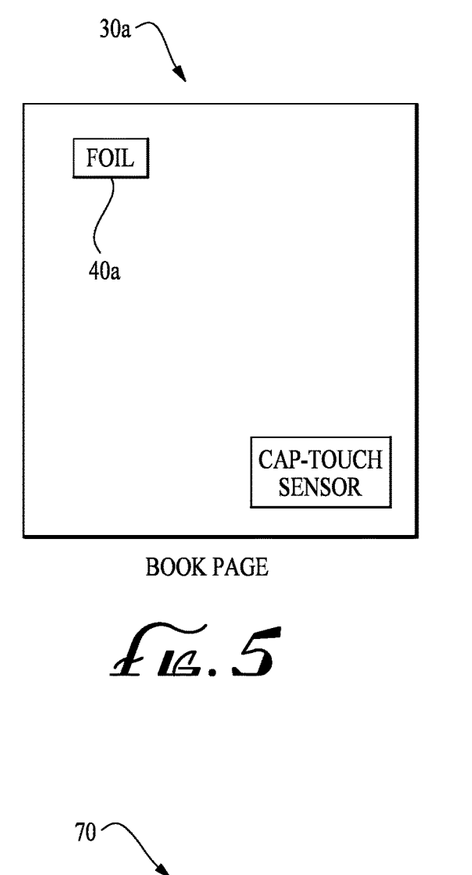
FIG. 5 is a top view of an item or page of the system of FIG. 1.
Figure 6:
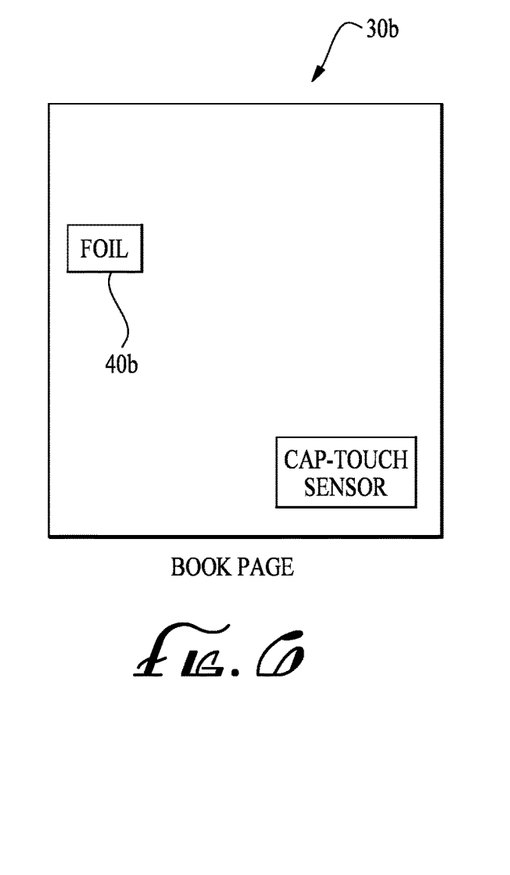
FIG. 6 is a top view of another item or page of the system of FIG. 1.

In an example mode of use, the system is installed in a children's device, such as an interactive book 10, 110. The IC and coil sensors 20, 120 can be embedded in the back cover of the book, as shown in FIGS. 1-3 and 8. In other embodiments, the IC and coil sensors are embedded in the front cover of the book or both covers contain sensors. Each page 30, 130 of the book has a substrate of detectable material, such as metallic foil 40, 140, embedded in the page, as shown in FIG. 5. In each different page, the metallic foil is in a different position, as shown in FIGS. 5, 6, 8 and 10A-10B. The IC is programmed to identify specific pages based on the position of the metallic foil substrate within the page. Based on which substrate positions the sensors detect, the IC can determine the page to which the book is open. Based on which page the book is open to, the IC can trigger outputs such as sounds, lights, vibrations, etc. The system can also include wireless communication technology so that the open book page can trigger a response in other devices.

In example embodiments, the IC and coil sensors can also determine the direction of motion and/or velocity of the detectable material. In this embodiment, the IC can determine when a page in the interactive book is turning, the direction in which is turning, and how fast it is turning. In other embodiments, the IC and coil sensors can detect pressure or contact—for example, use of a stylus or a press of a finger. In an interactive children's book, the page orientation and pressure data can be used to allow a child to press images on the open page to elicit a response from the book. For example, if the child presses a cow it can moo. In other examples, the book can request that the child draw a letter and play a congratulatory sound when it is drawn correctly. Because the IC can detect page position, interactive items can have the same position on different pages.

The system can also be used in a children's device having a base and a series of accessories. For example, a child seat or entertainer can include one or more recesses for receiving interchangeable accessories. The system detailed above can be used to determine which accessory is positioned in the recess. The presence or orientation of different accessories can trigger outputs such as sounds, lights, vibrations, etc. The system can also be used outside of the children's device space. For example, the system can be used to integrate a presenter's note cards with presentation materials such as a powerpoint or video. As the presenter moves different note cards, containing a detectable material, over a base or receiver a powerpoint slide or video portion can be triggered.

Figure 7:
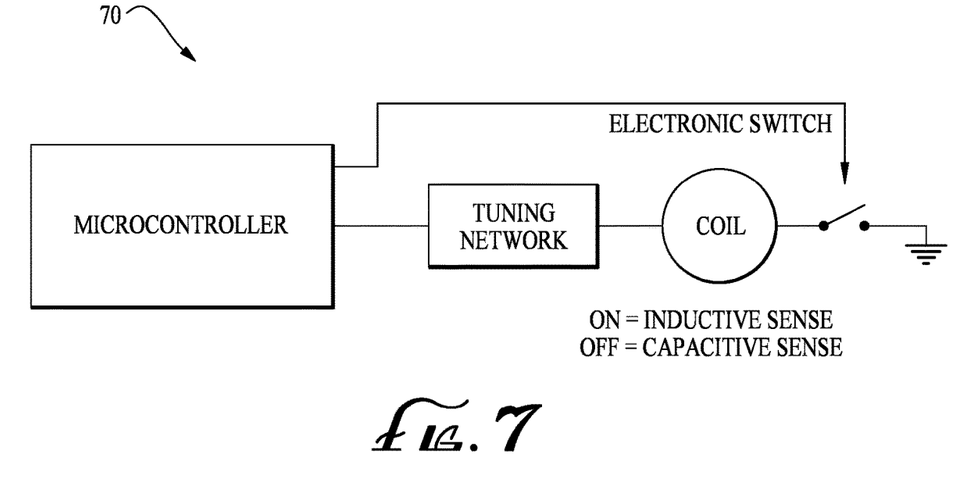
FIG. 7 is an electrical diagram of a base of a system for detection of position and motion that includes inductive and/or capacitive touch, position and/or motion technology.
Figure 8:
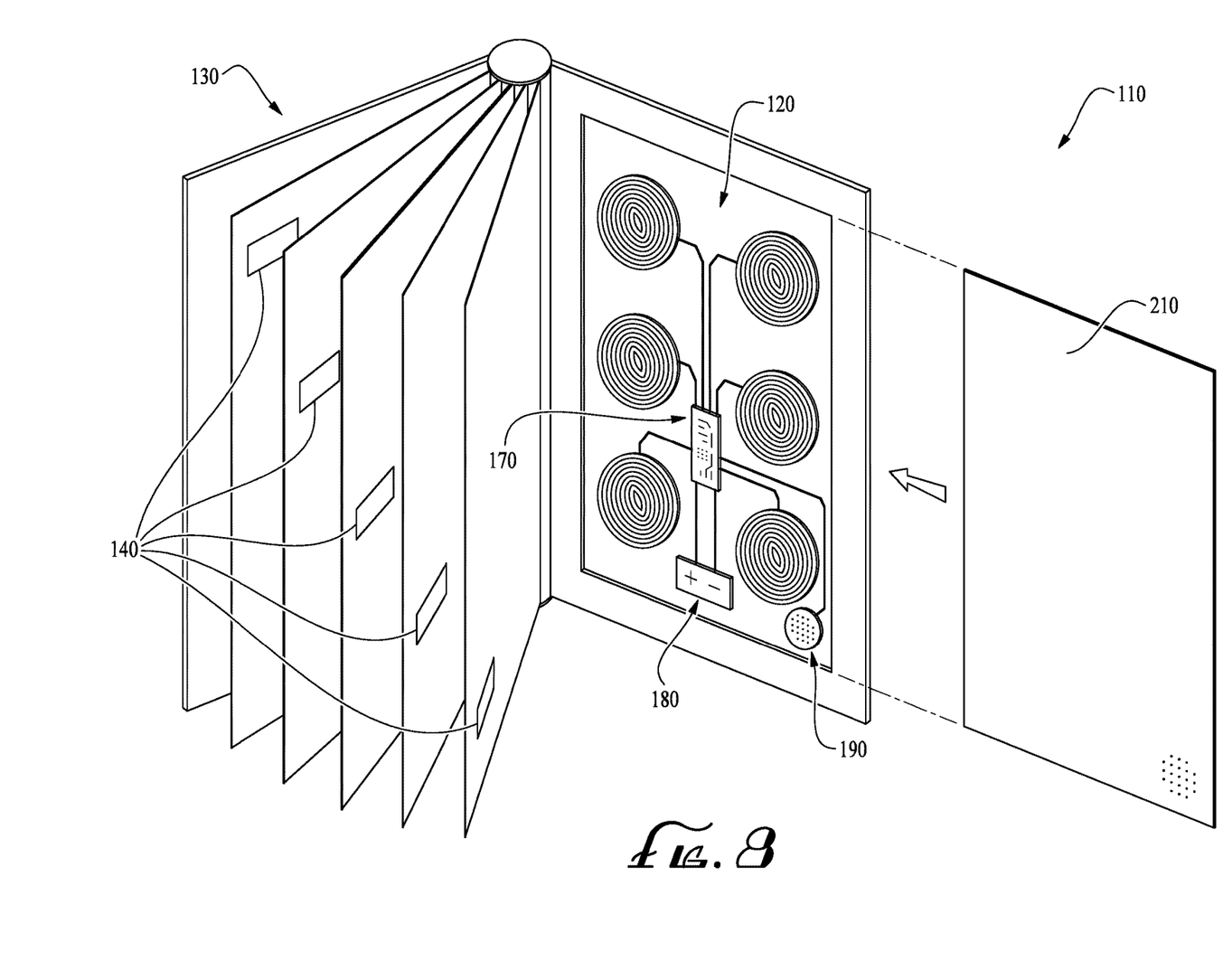
FIG. 8 is a perspective view of a system for detection of position and motion according to another example embodiment of the disclosure.
Figure 9:
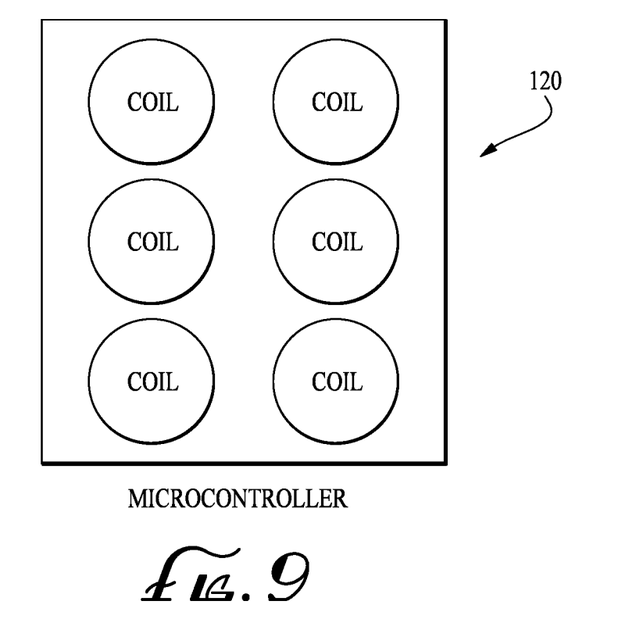
FIG. 9 is a schematic or plan view of a portion of the system of FIG. 8.
Figure 10A:
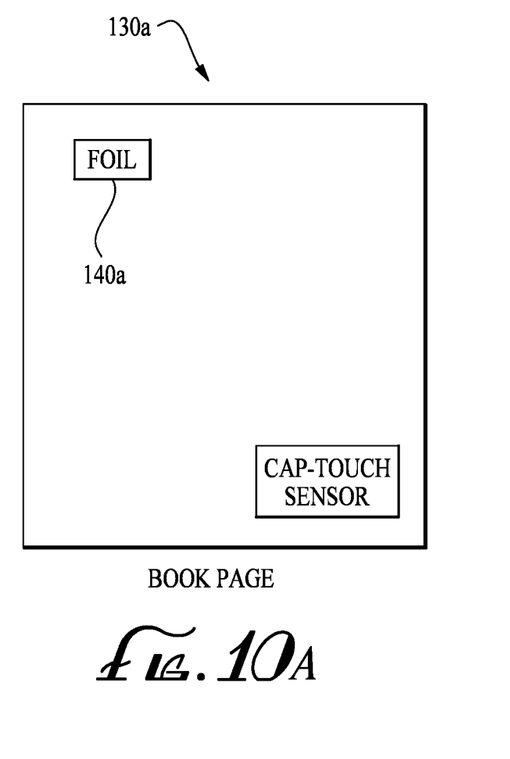
FIGS. 10A and 10B show page portions of the system of FIG. 8.
Figure 10B:
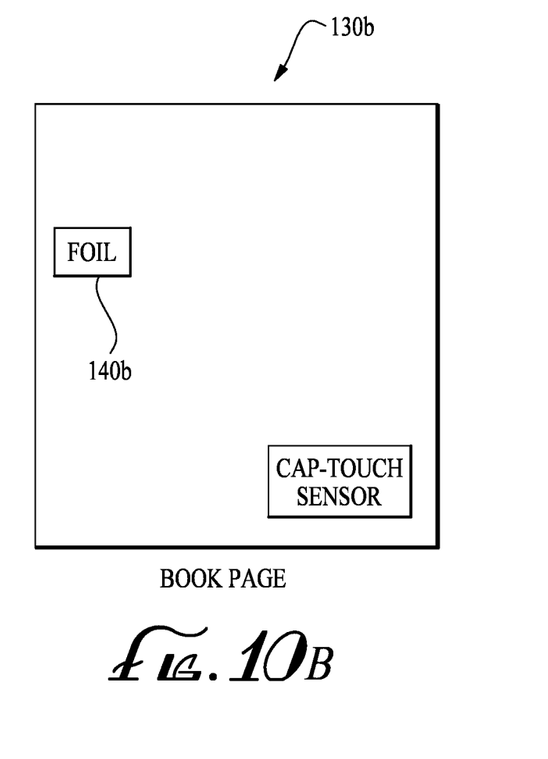
Figure 11:
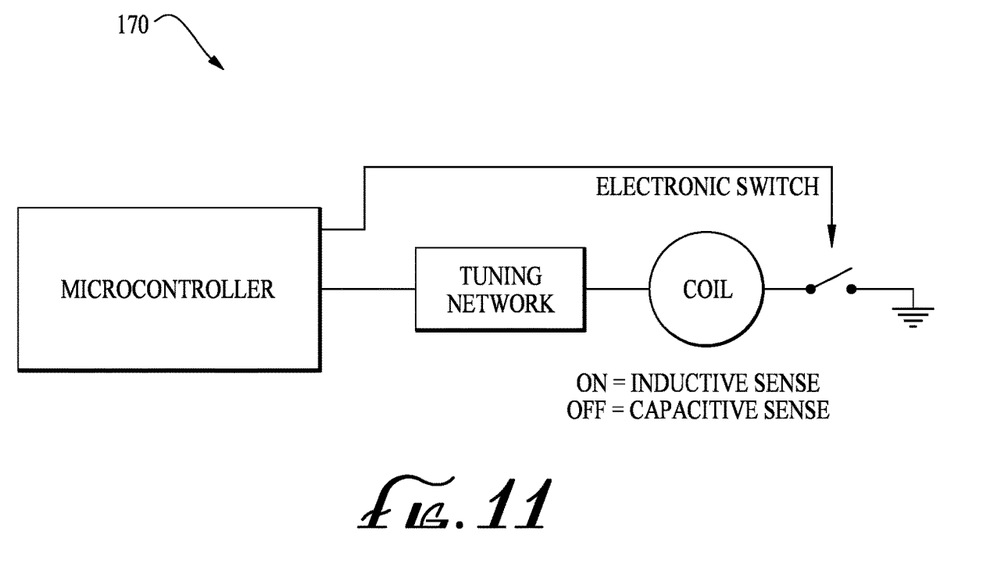
FIG. 11 is an electrical schematic of an electronic control portion of the system of FIG. 8.

As shown in FIGS. 7 and 11, example embodiments of the system can also include capacitive touch technology. A capacitive touch device 70, 170 generally includes an overlay layer, a sensor layer, and a base layer. The overlay layer is generally formed from a conductive material. The overlay layer may receive a user input (e.g., a touch, swipe, or other contact). The user input can be made by contact with skin, such as a finger touch, or contact with a conductive material, such as a conductive silicone or acrylonitrile butadiene styrene (ABS). The sensor layer can generate a sensor signal based on the user input. The sensor signal can include an indication of a location at which the user input was received by the overlay layer. The sensor signal can correspond to a change in capacitance of the sensor layer (or electrical components thereof) resulting from the user input. The sensor layer can generate the sensor signal based on capacitive coupling between the object contacting the overlay layer and the sensor layer. The sensor layer can generate the sensor signal using surface capacitance or projected capacitance. The sensor layer can include a conductor which acts as a capacitive layer. Example conductors include copper foil, polychlorinated biphenyl (PCB), and indium tinoxide (ITO). In other embodiments, other conductors can be used. The sensor layer can include a plurality of capacitive layers (which may be separated by corresponding insulating layers). The capacitive layers can include a variety of configurations including linear, grid, or radial.

Figure 1:
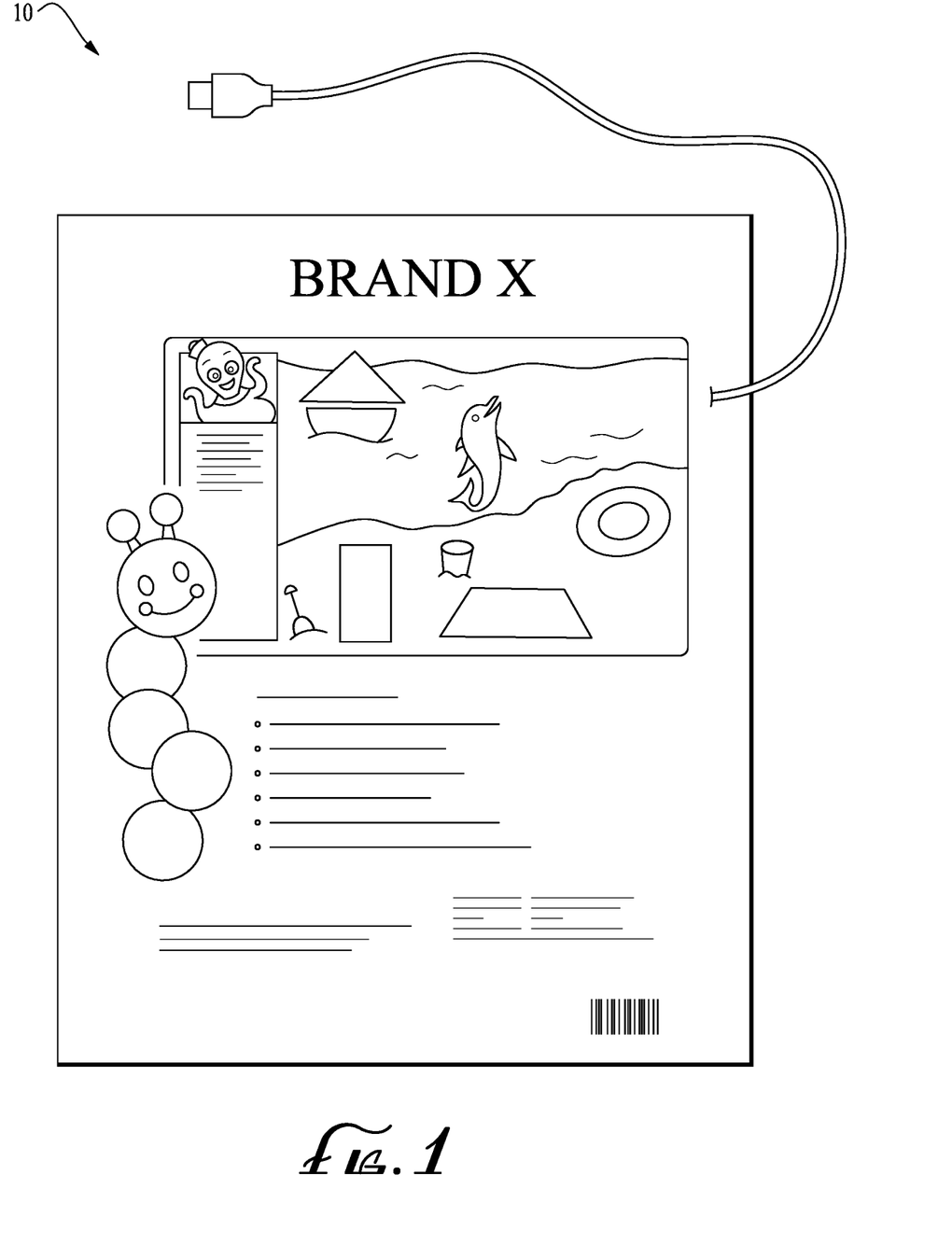
FIG. 1 is a top view of a base or cover of a system for detection of position and motion according to an example embodiment of the disclosure.
Figure 2:
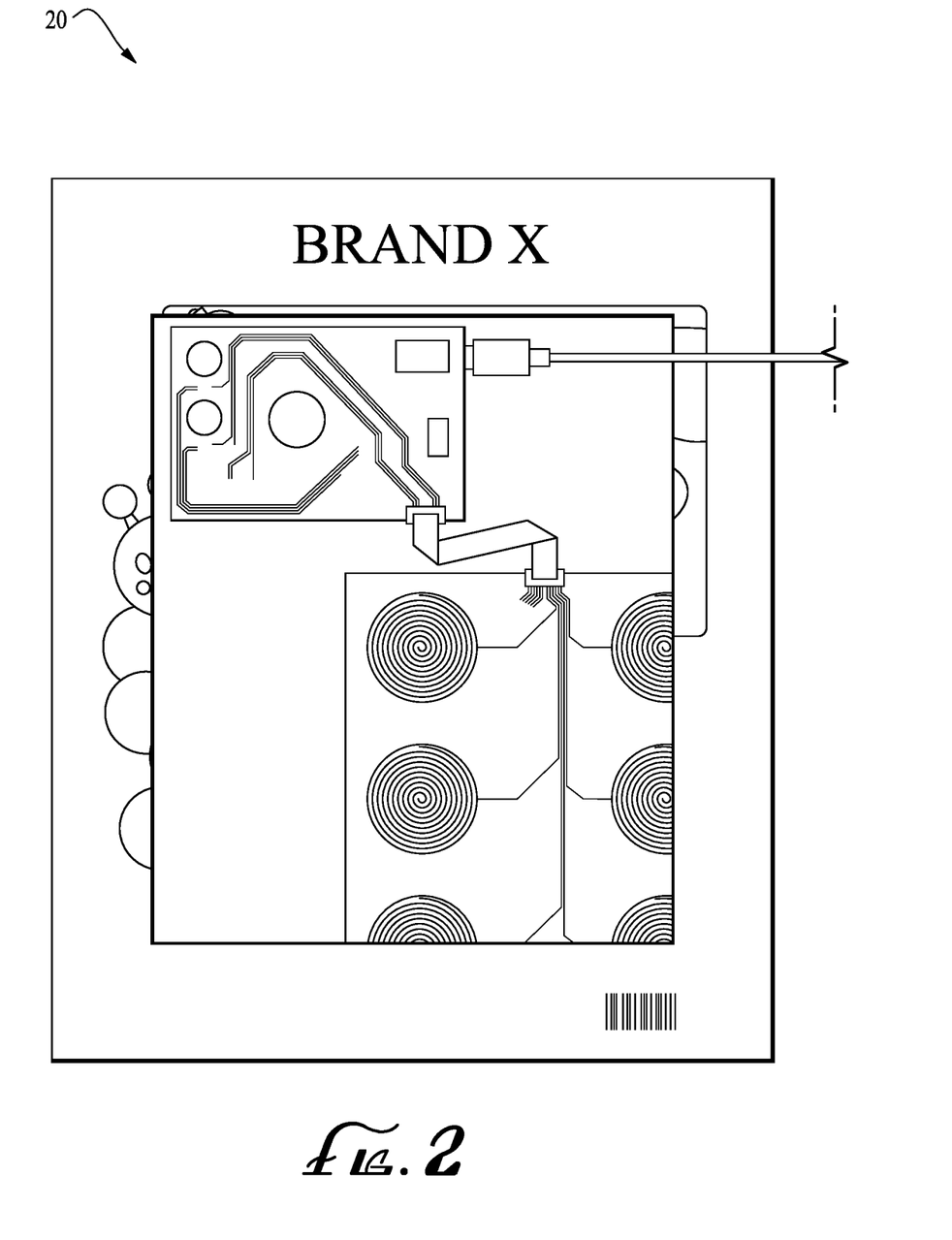
FIG. 2 is a cut-away view of the cover of FIG. 1.
Figure 3:
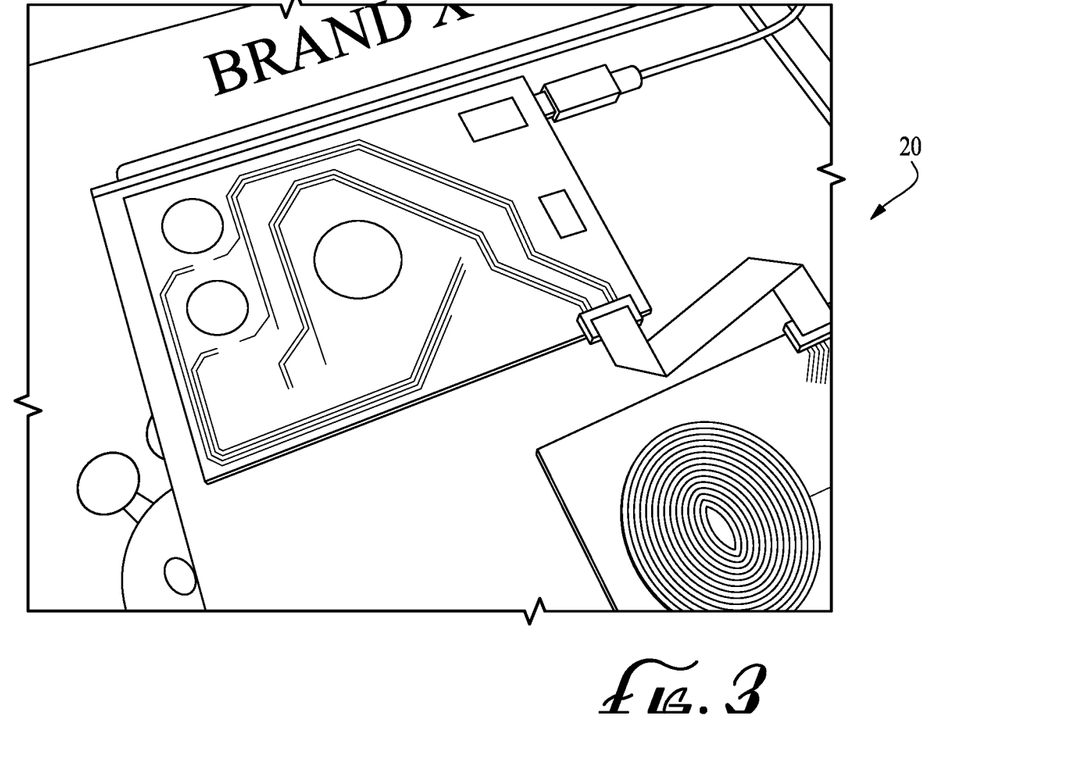
FIG. 3 is a detailed view of a portion of the cover of FIG. 2.
Figure 4:
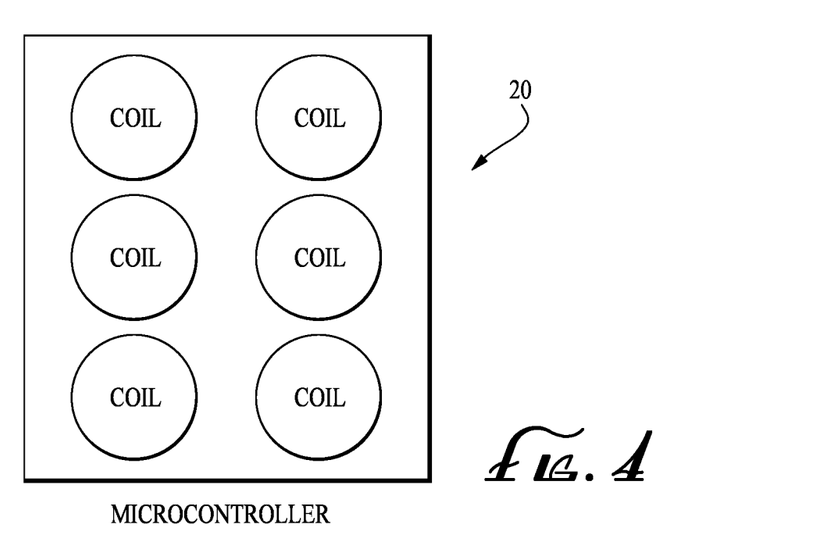
FIG. 4 is a top view of a base or cover of a system for detection of position and motion according to example embodiments of the present disclosure.

In example embodiments of the system of the present disclosure, the inside of the book cover and the pages act as the overlay material. They are formed from a conductive material such that a finger touch or contact with a conductive material is detected through the pages to the sensors. For detection of capacitive touch, the sensor coils shown in FIG. 2-4 are grounded at the far end, as shown in FIG. 7. An nFET transistor can be used at the far end to disconnect the coil or coils from ground so that the same coils can be used as a cap-touch sensor and an inductive sensor to determine page orientation. The system may optionally further comprise a battery or other power source 180, one or more speakers or other output devices 190, a cover panel 210, and/or additional components adapted to various applications and uses, for example to output recorded voice, music, light(s), vibration and/or other audio, video and/or haptic output(s) responsive to the sensed position and/or motion of the pages or other items.

While the disclosure has been described with reference to example embodiments, it will be understood by those skilled in the art that a variety of modifications, additions, and deletions are within the scope of this disclosure, as defined by the following claims.

What is claimed is:

1. A system for detection of position and motion comprising:
    a base comprising a sensor configured to detect the presence of a detectable material through induction and an integrated circuit configured to receive data from the sensor;
    a first item configured to be positioned over the base, the first item having a first single detectable component including a first embedded substrate of the detectable material; and
    a second item configured to be positioned over the base in a different position than the first item, the second item having a second single detectable component including a second embedded substrate of the detectable material;
    wherein the sensor and the integrated circuit determines the presence of the first and second items over the base.

2. The system of claim 1, wherein the base is a cover of a book and the first item and second item are book pages.

3. The system of claim 1, wherein the sensor is a coil configured to detect the presence and position of a small amount of metal.

4. The system of claim 1, wherein the detectable material is a metallic foil.

5. The system of claim 1, wherein the sensor is also configured to detect pressure exerted on one of the first item or the second item positioned over the base.

6. The system of claim 1, wherein the base further comprises capacitive touch technology.

7. The system of claim 1, further comprising
    a third item configured to be positioned over the base, the third item having a third embedded substrate of the detectable material; and
    a fourth item configured to be positioned over the base, the fourth item having a fourth embedded substrate of the detectable material that is different than the position of the embedded substrate of in the third item; and
    a second sensor configured to detect the presence of the detectable material through induction;
    wherein the base further comprises the second sensor and the second sensor and the integrated circuit determine the presence of the third and fourth items over the base.

8. A system for detecting an open page number of an interactive book comprising a cover and a plurality of pages; the system comprising:
    a metallic material substrate embedded at a position in each of the plurality of pages, wherein the embedded substrate position in each page is unique and the embedded substrate comprises a single material;
    an inductive sensor embedded in the cover of the book, wherein the inductive sensor is configured to detect the proximity of the embedded substrates; and
    an integrated circuit configured to process data received from the inductive sensor to determine the open page number.

9. The system of claim 8, wherein when at least one of the plurality of pages is moved away from the book cover, the inductive sensor detects a velocity of the page.

10. The system of claim 8, wherein when at least one of the plurality of pages is moved away from the book cover, the inductive sensor detects a direction of motion of the page.

11. The system of claim 8, further comprising a speaker.

12. The system of claim 11, wherein the sensor is also configured to detect a position of pressure exerted on the plurality of pages and wherein the speaker produces a sound based on the position of the pressure and the open page number.

13. The system of claim 11, wherein the speaker produces a different sound in response to each open page number.

14. A book comprising:
    a cover having a microcontroller and an inductive sensor electronically coupled to the microcontroller;
    a plurality of pages, each page comprising a non-resonating metallic substrate positioned for inductive sensing of position and/or motion of one or more of the plurality of pages by the inductive sensor; and
    an output device electronically coupled to the microcontroller configured to deliver an output responsive to the sensed position and/or motion of the pages,
    wherein the inductive sensor is configured to detect the presence of a plurality of the metallic substrates.

15. A method of detection of position and motion comprising:
    providing a base comprising a sensor configured to detect the presence of an item having a single detectable component including an embedded substrate of detectable material through induction and an integrated circuit configured to receive data from the sensor;
    providing a first item configured to be positioned over the base, the first item having a first embedded substrate of the detectable material; and
    providing at least a second item configured to be positioned over the base, the second item having a second embedded substrate of the detectable material; determining the presence and/or motion of at least one of the first and second items over the base by sensing at least one of the first and second embedded substrates by the first sensor.

* * * * *